United States Patent [19]

Kaplit

[11] 3,877,053

[45] Apr. 8, 1975

[54] VOLTAGE CONTROLLED VARIABLE AREA SOLID STATE TUNING CAPACITOR

[75] Inventor: Michael Kaplit, Troy, Mich.

[73] Assignee: General Motors Corporation, Detroit, Mich.

[22] Filed: May 7, 1973

[21] Appl. No.: 357,886

[52] U.S. Cl. .................................... 357/23; 357/14

[51] Int. Cl. .............................................. H01l 5/06

[58] Field of Search ..... 317/234 UA, 235 B, 235 G; 307/238

[56] References Cited

UNITED STATES PATENTS

| | | | |
|---|---|---|---|
| 3,560,815 | 2/1971 | Sigsbee | 317/234 UA |
| 3,612,964 | 10/1971 | Kawazu | 317/234 UA |
| 3,648,340 | 3/1972 | MacIver | 317/234 UA |

*Primary Examiner*—Andrew J. James
*Assistant Examiner*—William D. Larkins
*Attorney, Agent, or Firm*—Robert J. Wallace

[57] ABSTRACT

A solid state varactor having a region of one conductivity type whose effective area increases with applied controlling voltage in which the region serves as one plate of a parallel plate capacitor. A region of the one conductivity type semiconductor material is disposed within a surface of a semiconductor body of opposite conductivity type. A layer of dielectric on the semiconductor body overlies the periphery of the region as well. A conductive field plate on the dielectric layer overlies the periphery of the region and portions of said body contiguous the region.

4 Claims, 3 Drawing Figures

VOLTAGE CONTROLLED VARIABLE AREA SOLID STATE TUNING CAPACITOR

BACKGROUND OF THE INVENTION

This invention relates to solid-state voltage-variable capacitors and more particularly to a varactor having a region of one conductivity type that increases the effective area of a parallel plate capacitor with applied controlling voltage.

Solid-state nonlinear voltage-variable capacitors both of the metal-insulator-semiconductor and PN junction type are well known in the art. Metal-insulator-semiconductor voltage variable capacitors, or surface varactors as they are sometimes referred to, can be used in applications which require a large capacitance change of approximately 4:1. PN junction voltage-variable capacitors can be used in amplifiers, harmonic generators, FM tuners, and other devices where they are not required to generally exhibit large capacitance changes.

The prior art has been well aware that with an increasing reverse biased voltage, the capacitance of these varactors increases due to a widening of the depletion region of the PN junction. U.S. Pat. No. 3,404,320 Mash recognized that the increasing capacity of the junction is achieved by virtue of the expansion of the junction depletion layer, or of the depletion layer at a metal-semiconductor barrier under reverse applied voltage. U.S. Pat. No. 3,648,340 MacIver, assigned to the assignee of this present invention, realized that the large capacitance change generally required in AM radio receivers necessitates a correspondingly large voltage change. The voltage necessary to drive these surface varactors over such a capacitance range can often cause inversion of the semiconductor surface at the semiconductor-insulator interface. MacIver while recognizing that inversion at the interface will occur at a certain voltage, treated this inversion as negating further capacitance increase with increasing reverse bias voltage. MacIver solved this problem with a reverse biased PN junction contiguous the interface that prevented any appreciable inversion.

If a single varactor is to be used for tuning the entire band of a radio receiver, it must have a high ratio of maximum to minimum capacitance. Prior art varactors relied upon the change in width of the depletion region of the PN junction to achieve their capacitance change. Sufficiently wide depletion regions are difficult to attain and frequently only at the expense of other important varactor parameters. For example, complex doping profiles were required in order to effectively control the rate of change of capacitance with applied voltage. In mass production, control of minimum capacitance of such a device is difficult. Furthermore, since prior art varactors depended upon the PN junction being reverse biased, it required that there be means for electrical connection to both semiconductive regions of the device.

OBJECTS AND SUMMARY OF THE INVENTION

Therefore, it is an object of my invention to provide a solid state varactor device that has a large maximum to minimum capacitance ratio. Another object of this invention is to provide a solid state varactor in which exact production control of the minimum capacitance can be obtained. Furthermore, it is an object of this invention to provide a solid state varactor having a large capacitance change as a function of applied voltage without requiring complex doping profiles and electrical connection to both regions of the PN junction.

These and other objects of this invention are accomplished with a solid state varactor whose effective area increases with applied controlling voltage. An island region of one conductivity type semiconductor material with an electrode thereon is disposed within a surface of a semiconductor body of an opposite conductivity type. A dielectric layer covers the semiconductor body and the peripheral portions of the island region. A conductive field plate on and generally coextensive with the dielectric layer also overlies the region and serves as one field plate, with the disposed region in the semiconductor body serving as a second field plate.

DESCRIPTION OF THE PREFERRED EMBODIMENTS

Figure 1:
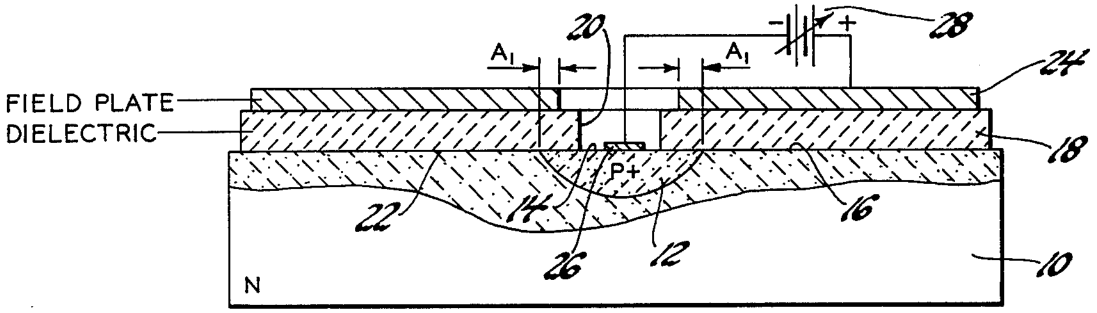
FIG. 1 is a sectional view showing a solid state varactor made in accordance with the invention and a schematic showing the polarity of a variable voltage source for which the varactor has a minimum capacitance.

Referring now to the drawings, a disc-like wafer of N-type conductivity silicon serves as a semiconductor body 10. Semiconductor body 10 is approximately 30 mils in diameter and has a thickness of approximately 0.01 inches. The resistivity of body 10 is approximately one ohm-cm.

A circular island of P-type conductivity silicon serves as region 12. P-type region 12 has a low resistivity, approximately equal to 0.02 ohm-cm. Region 12 is disposed within semiconductor body 10 so that face 14 of region 12 is coplanar with surface 16 of semiconductor body 10. As semiconductor body 10 is disc-shaped, it should be noted that region 12 is located, in this example, on the imaginary central axis of the semiconductor body 10. Region 12 is approximately .008 inch in diameter and as is noted in the drawings, extends within semiconductor body 10 approximately 0.001 inch from surface 16.

An annular layer of silicon dioxide ($SiO_2$) contiguous face 14 and surface 16 serves as an insulator or dielectric 18. Dielectric 18 is on a major portion of surface 16 of semiconductor body 10 which circumscribes and partially overlies face 14 of region 12. Dielectric 18 has a centrally located opening 20 approximately 0.003 inch in diameter which partially exposes face 14 of region 12. The dielectric 18 in this example is approximately 1,200 A thick. For ease of illustration, dielectric layer 18 has been described to be a single layer of silicon dioxide. It should be noted, however, that various dielectrics are acceptable, such as $Al_2O_3$ and $Ta_2O_5$. In fact, a second dielectric layer, such as silicon nitride may be superimposed over the first dielectric layer. As can be seen from the drawings the dielectric layer 18 contiguous surface 16 forms an interface 22 therebetween.

An aluminum annular sheet contiguous and generally coextensive with dielectric 18 serves as field plate 24. Field plate 24 is approximately 5,000 A thick. Similarly, as dielectric 18, field plate 24 also overlies a major portion of semiconductor body 10 and peripheral portions of region 12. For purposes of illustration in this example, the area of field plate 24 that overlies semiconductor body 10 is approximately $6.7 \times 10^{-4}$ inch square, while the area of the field plate 24 which overlies region 12 is approximately $1.2 \times 10^{-5}$ inch square. It should be evident to one skilled in the art that field plate 24 may also be constructed of suitable conductive material such as chrome or silicon.

A thin metallic electrode 26 makes the electrical connection to region 12 at face 14. A variable voltage source 28 is electrically connected between electrode 26 on region 12 and field plate 24. Voltage source 28 may be supplied, for example, by a typical DC battery and should have a potential to provide approximately ± 20 volts. It should be noted that in my invention no electrical connection is made to semiconductor body 10.

Although the microscopic phenomena of this invention is not completely understood, a generally accepted theory as to the electronic interaction of this device is ascertainable. Without any loss of generality we may assume flat band condition at interface 22 for voltage source 28 equal to zero. When the variable voltage source 28 is greater than or equal to zero, as in the case of FIG. 1, the capacitance of the device is due primarily to the overlap area of the field plate 24 and region 12. In effect, region 12 serves as one plate of a parallel plate capacitor with field plate 24 serving as the other plate. The conductive area of region 12 underlying field plate 24 will be herein referred to as the effective area of region 12. For ease of illustration, the overlap area, $A_1$, between field plate 24 and region 12 is exaggerated and fringing electronic fields will be neglected. Therefore, from basic electronic theory, the capacitance of the device when voltage source 28 is greater than or equal to zero is defined by $$C_{min} = \frac{E_i E_o A_1}{d} \qquad (1)$$

where $E_i$ is the relative permittivity of dielectric 18, $E_o$ is the permittivity of free space, $A_1$ is the overlap area between field plate 24 and region 12, and d is the thickness of the dielectric 18. It follows that this will be the minimum capacitance, $C_{min}$, of the device and is determined primarily by the overlap area between region 12 and field plate 24. It should be noted that this minimum capacitance may be accurately controlled in production by the shape and area of the field plate 24 and the region 12 and the overlap area therebetween.

Figure 2:
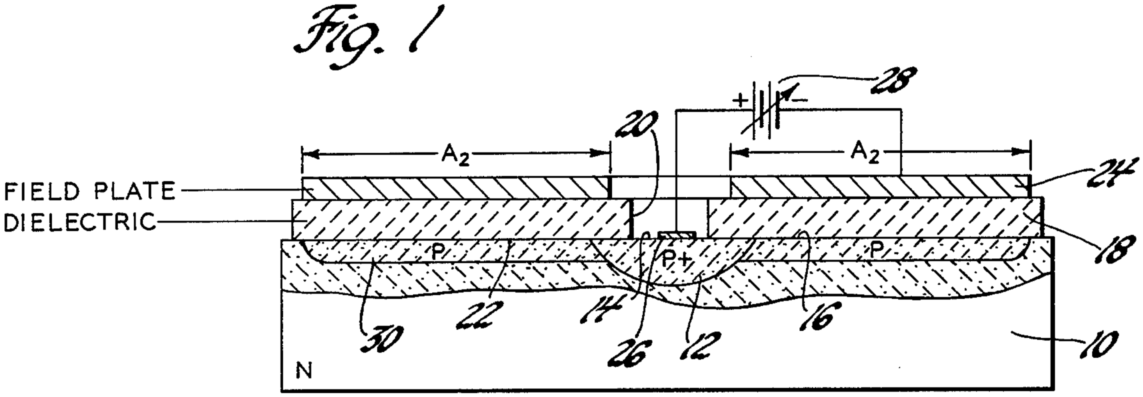
FIG. 2 is a sectional view showing a solid state varactor made in accordance with the invention and a schematic showing the polarity of a variable voltage source for which the varactor has a maximum capacitance.

Referring now to FIG. 2, the voltage source 28 now has a negative potential; that is, the field plate 24 is at a lower potential than that of region 12. As voltage source 28 becomes less than zero, the negative potential of the field plate 24 drives electrons away from surface 16 of semiconductor body 10 at interface 22. Holes, not electrons, are now the dominant charge carrier at interface 22 of the N-type semiconductor body 10. The interface 22 is now said to be inverted or an inversion layer 30 has been created at the interface. This inversion layer opposite the field plate 24 is equivalent of a thin highly conducting P-type semiconductor material. This inversion layer 30 is in electrical contact with region 12. The more electrons that are driven away by the increasingly negative voltage source 28, the more conductive the electrical contact therebetween will become. The capacitance measured between the field plate 24 and region 12 is now the capacitance between the field plate 24 and the highly conducting inversion layer 30 as well as the overlap area. Since region 12 serves as one plate of the varactor and the inversion layer is shorted thereto, the effective area of region 12 has been increased. This inversion layer which determines $C_{max}$ is approximately equal in area to the field plate 24 and is designated in FIG. 2 and $A_2$. This capacitance is the maximum capacitance, $C_{max}$, of the device and is defined by $$C_{max} = \frac{E_i E_o A_2}{d} \qquad (2)$$

where $E_i$, $E_o$, $d$ are the same as in equation (1).

Figure 3:
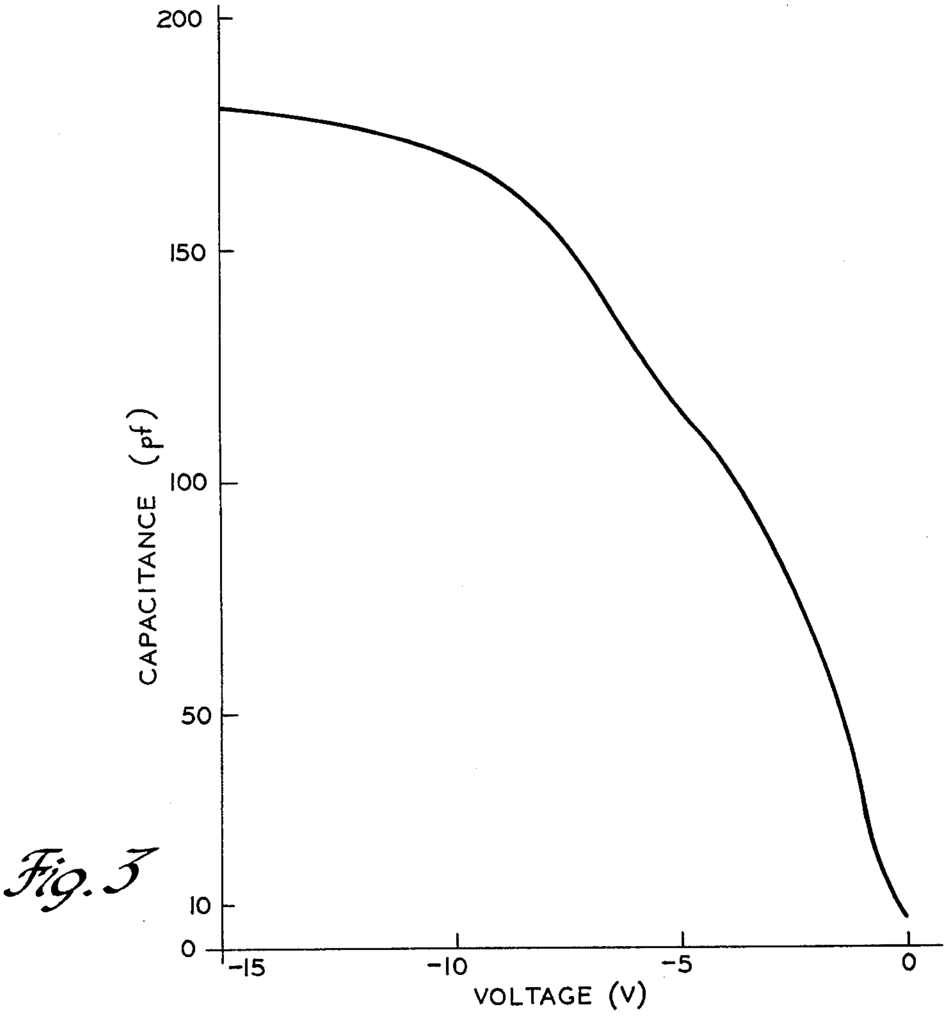
FIG. 3 is a graph illustrating the change in capacitance vs. the controlling voltage for the solid state varactor of this invention.

It should now be evident to one skilled in the art that the value of $C_{min}$ is determined primarily by the overlap area between region 12 and field plate 24, while $C_{max}$ is determined by the area of the field plate. Therefore, the ratio between $C_{max}$ and $C_{min}$ is approximately equal to $A_2/A_1$. The capacitance transition from $C_{min}$ to $C_{max}$ is a relatively smooth function of voltage source 28 as can be seen in FIG. 3. Near $C_{min}$ it should be evident that the rate of change of capacitance will be a function of the shape of region 12 at interface 22.

It should be realized that although this invention has been described in connection with a certain specific example, no limitation is intended thereby except as defined in the appended claims. It should be noted that my invention could be easily incorporated as part of an integrated circuit. My invention would also function equally as well if the conductivity type of region 12 and semiconductor body 10 were interchanged and the polarity of voltage source 28 was reversed as is well understood in the art. Similarly, as hereinbefore mentioned, variations of the materials used for the dielectric and field plate should be understood as lying within the scope of this invention.

It is claimed:

1. A solid state two electrode parallel plate-type variable area varactor that provides a large change in capacitance by increasing the effective area of a region in a semiconductive body portion in which said region serves as one plate of the parallel plate varactor, said varactor comprising a semiconductor body having a major surface, a region of one conductivity type semiconductive material disposed within said body and intersecting said major surface, said region having an effective area which serves as a variable area plate for said parallel plate varactor, portions of said body including said major surface contiguous said region being of an opposite conductivity type, a layer of dielectric material on parts of said region and contiguous major surface portions, only two electrodes on said varactor for receiving a variable voltage thereto and for supplying the output capacitance thereof, a first electrode on said dielectric overlying parts of said region and an area of said body portions contiguous said region, said first electrode serving as a fixed area opposite plate for said parallel plate varactor in which the area of said first electrode overlying said region determines the minimum capacitance for said varactor irrespective of doping levels in said contiguous body portions, a second electrode on said region electrically insulated from said first electrode, said body portions being electrode-free whereby said body portions will electrically float with voltages applied between said first and second electrodes, said varactor having an entire range of output capacitance that varies directly with the area of said first electrode overlying the effective area of said region, said effective area underlying said first electrode expandable as a direct function of an applied controlling voltage between said first and second electrodes having a polarity at said second electrode which is the same as the conductivity type of said region and having a polarity at said first electrode so as to invert the conductivity type of the semiconductive material of said contiguous body portions underlying said first electrode to the same conductivity type as said region, thereby progressively increasing the effective area of said region and the capacitance of said varactor.

2. A solid state two electrode parallel plate-type variable area varactor suitable for AM radio frequency band tuning that provides a maximum to minimum capacitance ratio greater than 4:1 by increasing the effective area of an island region in a semiconductor body in which said island region serves as one plate of the parallel plate varactor, said varactor comprising a body of semiconductive material having a generally flat major surface, portions of said body including said major surface being of one conductivity type, an island region of an opposite conductivity type semiconductive material, said island region having a generally flat face, said island region being disposed within a centrally located portion of said major surface of said body wherein said face of said island region is coplanar with said major surface of said body, said region having an effective area which serves as a variable area plate for said parallel plate varactor, a layer of dielectric material on said major surface of said body circumscribing said face of said island region, said dielectric layer overlying peripheral portions of said island region, only two electrodes on said varactor for receiving a variable voltage thereto and for supplying the output capacitance thereof, a first electrode on said dielectric circumscribing said face of said island region, said first electrode overlying said peripheral portions of said island region and an area of said body portions contiguous said island region, said first electrode serving as a fixed area opposite plate for said parallel plate varactor in which the area of said first electrode overlying said island region determines the minimum capacitance for said varactor irrespective of doping levels in said contiguous body portions, a second electrode on said island region electrically insulated from said field plate, said body portions being electrode-free whereby said body portions will electrically float with voltages applied to said first and second electrodes, said varactor having an entire range of output capacitance that varies directly with the area of said first electrode which overlies said effective area of the island region, said effective area underlying said field plate being expandable by applying a voltage between said first and second electrodes having a polarity at said second electrode which is the same as the conductive type of said island region and at said first electrode so as to progressively invert the semiconductive material of the area of said contiguous body portions underlying the first electrode to the same conductivity type of said island region, and thereby progressively increase the entire range of output capacitance of said varactor as a direct function of the applied voltage.

3. An electrical circuit that provides a large change in capacitance including a distinctive solid state two electrode parallel plate-type variable area varactor having a region of semiconductive material whose effective area is a function of an applied voltage and serves as one plate of the parallel plate varactor, and a variable voltage source for applying a controlling voltage between said region and an overlying field plate electrode, said circuit comprising means for applying a variable voltage, a body of one conductivity type semiconductive material having a major surface, a region of an opposite conductivity type semiconductive material disposed within said body and intersecting said major surface, said region having an effective area serving as a variable area plate for said parallel plate varactor, a layer of dielectric material on said major surface of said body and on portions of said region, only two electrodes on said varactor for receiving said variable voltage means and for supplying the output capacitance of said varactor, a first electrode on said dielectric layer with portions thereof overlying portions of said region and an area of said body contiguous said region, said first electrode serving as a fixed area opposite plate for said parallel plate varactor in which the area of said first electrode overlying said region determines the minimum capacitance for said varactor irrespective of doping levels in said body, a second electrode on said region electrically insulated from said electrode, said means for applying the variable voltage in electrical connection only between said first and second electrodes, except for said region said body being electrode-free with no direct electrical connection to said voltage means thereby electrically floating said body, said voltage means having a polarity at said second electrode which is the same as the conductivity type of said region and of the opposite polarity at said first electrode so as to progressively invert the semiconductive material of said body underlying said first electrode contiguous said region to the same conductivity type as said region thereby progressively increasing the effective area of said region underlying said first electrode and proportionally increasing the output capacitance of said varactor, wherein the entire range of said output capacitance varies directly with the overlying area between said variable effective area of said region and said first electrode.

4. An electrical circuit that provides a capacitance ratio of greater than 4:1 for AM radio frequency band tuning applications including a distinctive solid state two electrode parallel plate-type variable area varactor having a region of semiconductive material whose effective area is a function of an applied voltage and which serves as one plate of the parallel plate varactor, and a variable voltage source for applying a controlling voltage to said region and an overlying field plate electrode, said circuit comprising means for applying a variable voltage, a body of one conductivity type semiconductive material, said body having a generally flat major surface, an island region of an opposite conductivity type semiconductive material, said island region having a generally flat face, said island region being disposed within a centrally located portion of said major surface of said body so that said face of said island region is in the same plate thereof, said island region having an effective area serving as a variable area plate for said parallel plate varactor, a layer of dielectric material on said major surface of said body and surrounding said face of said island region with said dielectric partially overlying portions thereof, only two electrodes on said varactor for receiving said variable voltage means and for supplying the output capacitance of the varactor, a first electrode on said dielectric layer and circumscribing said face of said island region, said field plate partially overlying said face of said island region and portions of said body contiguous said island region, said first electrode serving as a fixed area opposite plate for said parallel plate varactor in which the area of said first electrode overlying said island region determines the minimum capacitance for said varactor irrespective of doping levels in said body, a second electrode on said face of said island region electrically insulated from said first electrode, said means for applying a variable voltage in electrical connection only between said first and second electrodes, except for said island region said body being electrode-free with no direct electrical connection to said voltage means thereby electrically floating said body, said voltage means having a polarity at said second electrode which is the same as the conductivity type of said island region and of an opposite polarity at said first electrode so as to progressively invert the underlying semiconductive material of said body contiguous said island region to the same conductivity type as said island region thereby progressively increasing the effective area of said island region and the output capacitance of said varactor as a direct function of said voltage means, wherein the entire range of said output capacitance varies directly with the overlying area between said variable effective area of the region and said first electrode.

* * * * *